United States Patent [19]

Rosenkranz

[11] 4,302,484
[45] Nov. 24, 1981

[54] POLYMERS CROSSLINKABLE BY ELECTRON BEAMS

[75] Inventor: Hans J. Rosenkranz, Krefeld, Fed. Rep. of Germany

[73] Assignee: Bayer Aktiengesellschaft, Fed. Rep. of Germany

[21] Appl. No.: 105,393

[22] Filed: Dec. 19, 1979

Related U.S. Application Data

[62] Division of Ser. No. 957,894, Nov. 6, 1978, abandoned.

[30] Foreign Application Priority Data

Nov. 10, 1977 [DE] Fed. Rep. of Germany ....... 2750285

[51] Int. Cl.³ .............................................. B05D 3/06
[52] U.S. Cl. ................................. 427/44; 204/159.14; 428/451; 428/463; 428/522; 526/262; 526/305; 526/326
[58] Field of Search ................... 427/44; 526/262, 305, 526/326; 204/159.14

[56] References Cited

U.S. PATENT DOCUMENTS

| | | | |
|---|---|---|---|
| 2,650,215 | 8/1953 | Strain | 526/262 |
| 3,426,228 | 2/1969 | Barrie et al. | 526/262 |
| 3,666,720 | 5/1972 | Nield et al. | 526/262 |
| 3,676,404 | 7/1972 | Nield | 526/262 |
| 3,719,522 | 3/1973 | Johnson et al. | 427/44 |
| 3,749,592 | 7/1973 | Gaske et al. | 427/44 |
| 3,756,991 | 9/1973 | Kuhne et al. | 526/262 |
| 3,770,602 | 11/1973 | D'Alelio | 427/44 |

*Primary Examiner*—Harry Wong, Jr.
*Attorney, Agent, or Firm*—Connolly and Hutz

[57] ABSTRACT

Resist lacquers crosslinking under the influence of electron beams of which the active constituents is a copolymer of (A) 10 to 90 moles of a $C_1$–$C_{20}$ alkyl ester of acrylic acid and/or methacrylic acid; (B) 0 to 50 moles and, preferably 10 to 50 moles, of a hydroxyl-group-containing $C_1$–$C_{10}$ alkyl ester of acrylic and/or methacrylic acid, and (C) 3 to 70 moles and, preferably 10 to 50 moles, of a monomer which contains the structural element

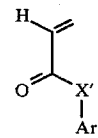

wherein

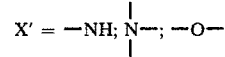

—O— and Ar is an aromatic radical.

12 Claims, No Drawings

POLYMERS CROSSLINKABLE BY ELECTRON BEAMS

CROSS REFERENCE TO RELATED APPLICATION

This application is a division of application Ser. No. 957,894, filed Nov. 6, 1979 and now abandoned.

This invention relates to resist lacquers which crosslink under the effect of high energy radiation.

Polymers which crosslink under the effect of UV-light, and which can be used as resist lacquers, are already known. Examples of such polymers are optionally modified polyvinyl cinnamates and also those containing chalcone or stilbene groups. Many polymers, for example synthetic rubbers, can be crosslinked by the effect of UV-light providing certain bisazido compounds are added to them. A survey of photocrosslinking materials is presented by J. Kosar in "Light Sensitive Systems", John Wiley & Sons, New York-London-Sydney, 1965.

Under the action of UV-light, photocrosslinking polymers (hereinafter referred to as "resist systems") form insoluble resistant coatings. Accordingly, resist systems may be applied as thin layers to a substrate, exposed to form an image and "developed" by dissolving out the unexposed parts with organic solvents. Because the unexposed parts are dissolved out, the resists obtained are called negative resists.

Attempts have also been made to harden resist systems with electron beams. Unfortunately, the results obtained have so far been unsatisfactory for practical purposes.

However, since a higher resolution in layers exposed to form an image can be obtained with electron beams than with UV-light, resist lacquers suitable for this type of crosslinking are required for the further miniaturisation of printed circuits and integrated electronic components.

Accordingly, the present invention provides resist lacquers crosslinking under the affect of electron beams of which the active constituent is a copolymer of (A) 10 to 90 moles of a $C_1$-$C_{20}$-alkyl ester of acrylic acid and/or methacrylic acid;

(B) 0 to 50 moles and preferably 10 to 50 moles of hydroxyl-group-containing $C_1$-$C_{10}$-alkyl ester of acrylic and/or methacrylic acid, and (C) 3 to 70 moles and preferably 10 to 50 moles of a monomer which contains a structural element corresponding to the formula

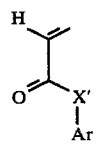

wherein

X' is 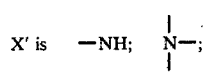

or —O— and Ar is an aromatic radical.

The polymers on which the resist lacquers according to the invention are based may additionally contain from 0 to 30 moles of an unsaturated carboxylic acid, from 0 to 40 moles of acrylamide, methacrylamide or the N-alkyl substitution products thereof and/or from 0 to 70 moles of styrene, α-methyl styrene, acrylonitrile, vinylacetate, vinyl propionate, a vinylalkyl ether having from 1 to 8 carbon atoms in the alkyl moiety, methacrylonitrile, allylacetate, vinyl chloride, vinylidene chloride, maleic imide or maleic anhydride in copolymerised form.

Preferred monomers A are methylacrylate, ethylacrylate, butylacrylate, propylacrylate, ethylhexylacrylate, dodecylacrylate, methyl methacrylate, ethyl methacrylate, propyl methacrylate, butyl methacrylate, and dodecyl methacrylate.

Preferred monomers B are hydroxyethylacrylate, hydroxy propylacrylate, hydroxyethyl methacrylate, and hydroxy propyl methacrylate.

Suitable unsaturated carboxylic acids are acrylic acid, methacrylic acid, maleic acid, and fumaric acid.

Monomers C are preferably monomers corresponding to any one of the formulae 1 to 3 below:

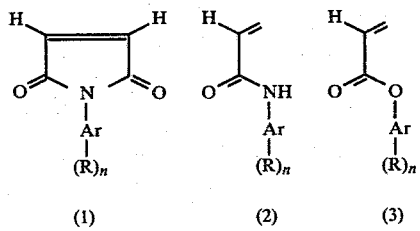

(1) (2) (3)

Accordingly, the monomers in question are N-aryl derivatives of maleic imide and acrylic amide and certain aryl esters of acrylic acid. In the above formulae:

Ar is an up to hexafunctional aryl radical which contains from 6 to 18 carbon atoms and which consists of 1 to 3 rings;

R represents hydrogen, $C_1$-$C_{12}$-alkyl; halogen (preferably chlorine, bromine); O-alkyl ($C_1$-$C_{12}$); O—$(CH_2CH_2$—$O)_{1-4}$—H; O—$(CHCH_3$—$CH_2O)_{1-4}$—H; nitro; —COOH; —CHO; —COO alkyl ($C_1$-$C_{12}$); —CN; —CONH$_2$; —CONH—alkyl ($C_1$-$C_{12}$); —CON—(alkyl ($C_1$-$C_{12}$))$_2$; or —NHCO alkyl ($C_1$-$C_{12}$) and n is an integer from 1 to 5.

Examples of particularly suitable aryl radicals are phenyl, biphenyl, anthracenyl, phenanthryl, and naphthyl. These radicals are with particular preference substituted by 1 to 5 halogen atoms, particularly chlorine atoms.

Monomers corresponding to formula (1) may be produced in accordance with U.S. Pat. No. 3,433,801. Examples of these monomers are phenyl maleic imide, p-methylphenyl maleic imide, 2,4-dimethyl phenyl maleic imide, p-methoxy phenyl maleic imide, 3,5-dimethoxy phenyl maleic imide, 3,4-dimethoxy phenyl maleic imide, p-chlorophenyl maleic imide, 3,4-dichlorophenyl maleic imide, 2,4,5-trichlorophenyl maleic imide, m-methoxy phenyl maleic imide, 2,4-dimethoxy-5-chlorophenyl maleic imide, 2,4,6-trichlorophenyl maleic imide, 3-chloro-4-methoxy phenyl maleic imide, 2-methoxy-5-chlorophenyl maleic imide, p-nitrophenyl maleic imide, m-nitrophenyl maleic imide p-acetylphenyl maleic imide, p-acetylaminophenyl maleic imide, p-carboxymethyl phenyl maleic imide, naphthyl maleic imide, and 5-methoxy naphthyl maleic imide.

Monomers corresponding to formula (2) may be similarly obtained after reaction of the amino compounds used for producing the above mentioned maleic imides with acrylic acid chloride. One typical process is described for example in "Organikum," VEB-Deutscher Verlag d. Wissenschaften, Berlin, 1973, page 453. Examples are N-phenyl acrylamide, p-methyl phenyl acrylamide, p-methoxy phenyl acrylamide, 3,5-dimethoxy phenyl acrylamide, p-chlorophenyl acrylamide, 2,4-dichlorophenyl acrylamide, 2,4,5-trichlorophenyl acrylamide, 2,4-dimethoxy-5-chlorophenyl acrylamide, 2-chloro-4-methoxy phenyl acrylamide, p-nitrophenyl acrylamide, p-acetylphenyl acrylamide, and N-naphthyl acrylamide.

Monomers corresponding to formula (3) may also be obtained in accordance with "Organikum", VEB-deutscher Verlag d. Wissenschaften, Berlin 1973, pages 446. Examples are phenylacrylate, p-chlorophenylacrylate, 3,4-dichlorophenylacrylate, 3,4,5-dichlorophenylacrylate, 2,3,4,5,6-pentachlorophenylacrylate, and 4-methoxy-5-chlorophenylacrylate.

The polymers on which the resist systems according to the invention are based may be obtained by subjecting the monomers to radical polymerisation in solution, in bulk, in suspension or in emulsion. Standard initiators, such as peroxides, azo compounds or redox systems may be used for this purpose. Polymerisation may also be initiated by light in the presence of suitable photoinitiators. However, it is important in this connection to use light which does not give rise to any crosslinking in the polymer formed.

Additive which reduce molecular weight may be added during polymerisation in quantities of from 0.01 to 5 mole %. Additives of this type are, for example, n-butyl mercaptan, tert.- or n-dodecyl mercaptan; ethylene glycol dimercaptoacetate, pentaerythritol trimercaptoacetate, thioglycol, thioglycerol, thioglycolic acid, and carbon tetrachloride.

The polymers are solid, soluble resins having a preferred molecular weight in the range of from 5000 to 50,000. They may be dissolved in standard lacquer solvents and may be applied in this form to the required substrates where they form the resist film following removal of the solvents.

A typical polymer suitable for the purposes of the invention may be produced for example as follows:

An acrylic acid and/or methacrylic acid alkyl ester, an acrylic acid and/or methacrylic acid oxyalkyl ester and a monomer corresponding to any of formulae (1) to (3) are dissolved in substantially equal parts in a solvent of the type commonly used for polymerising vinyl compounds, and are polymerised by means of an organic peroxide. The resin solution obtained may be used directly (optionally after filtration) for producing the resist film. The polymer may even be precipitated, isolated and purified before it is further processed to form the resist film.

In addition to the polymer and a suitable solvent, the resist system according to the invention may normally contain other standard constituents. For example, it is possible to add hydroxyl-group-containing polymers or polycondensates and also sensitisers, photoinitiators or dyes.

Virtually any solvent in which the polymers according to the invention are readily soluble may be used for producing the resist layer. Suitable solvents are, for example, chlorinated hyrocarbons, higher alcohols, esters, and aromatic hydrocarbons.

Suitable substrates are, for example, any of the materials used in the electronic industry, such as metal foils of copper, aluminium, zinc, magnesium, or steel and supporting surfaces, for example of silicon as used in the production of semiconductors. Layers of virtually any thickness may be produced on these substrates, depending upon the concentration of the polymer solution. In the microelectronics field, layer thicknesses of less than $5\mu$ m are used in order to obtain good reproduction of even the finest details.

The resist systems according to the invention are preferably crosslinked by electron beams. Very small radiation does of from $10^{-6}$ to $10^{-3}$ doulombs/cm$^2$ are sufficient. Electron beams having an energy of from 1000 to 100,000 eV are normally used. In principle, it is possible to use other forms of particularly high-energy radiation (X-rays, gamma-rays), although it is preferred to use electron beams.

Crosslinking may also be effected by the action of short-wave UV-light. For example, the light of a medium- or low-pressure mercury lamp or even the short-wave fraction of a high-pressure mercury lamp or carbon arc lamp, i.e. in the wavelength range below 320 nm, quickly results in crosslinking.

After irradiation and, hence crosslinking, the resist layer may be "developed" with a solvent. Which solvents are particularly suitable for this purpose will depend above all upon the composition of the polymer. An optimum solvent for a given polymer composition may be determined by simple tests well known to those skilled in the art. In general, aromatic hydrocarbons, chlorinated hydrocarbons or esters are suitable. Where the polymers contain a polymerised unsaturated acid, such as acrylic acid or methacrylic acid, the resist layer may even be developed with aqueous alkali. In that case, a 1% to 2% soda solution is generally used.

In order to test the quality of the resist layers and the crosslinked coatings developed to form an image on the substrate, a standard dye may be added to the resist system. It is possible to use virtually any dye which is soluble in organic solvents, as well as organic and inorganic coloured pigments.

In general, the substrates carrying the resist films developed to form an image are etched or electroplated with metals (for example for producing printed circuits). In this respect, the resists according to the invention are distinguished by their particular resistance. They also adhere firmly to the surface, and enable even the finest details and structures to be reproduced. After etching or electrodeposition, the resist film carrying the image may be removed from the substrate with suitable solvents. Suitable solvents may be determined by simple tests well known to those skilled in the art. Examples of suitable solvents are dimethyl formamide, halogenated hydrocarbons, organic acids and aqueous alkalis.

The resist systems according to the invention are suitable for the production of integrated electronic components and also for the production of relief images and printing plates for relief printing, intaglio printing or surface printing, for example for offset printing, screen printing and lithographic printing plates and half-tone photo-reproduction.

EXAMPLE 1

In a 250 ml capacity three-necked spherical flask equipped with a reflux condenser, stirrer and dropping funnel, 50 g of methylethyl ketone was heated to boiling temperature while nitrogen was passed therethrough. A mixture of 6.7 g (0.05 mole) of hyroxyethylacrylate, 6.4 g (0.05 mole) of butylacrylate, 0.27 g (1%) of azoisobutyrodinitrile and 13.8 g (0.05 mole) of 2,4,5-trichlorophenyl maleic imide dissolved in 40 g of methylethyl ketone were then added dropwise over a period of 1 hour. A solution of 0.14 g of azoisobutyrodinitrile dissolved in 20 g of methylethyl ketone was then added also dropwise over a period of another hour with continued boiling. After boiling under reflux for a further hour, the polymer solution obtained was concentrated, dissolved in methylene chloride, filtered, and subsequently precipitated in petroleum ether. The dry polymer had a chlorine content of 19.6% (theoretical: 19.7% Cl).

The polymer was redissolved in a mixture of methylene chloride and methyl glycolacetate and applied to a copper-lined polyester film in a layer thickness of approximately $3\mu$ m. A piece of this film measuring $2 \times 2$ cm was introduced into an electron microscope where part of the surface was exposed to an electron beam having an energy of 2000 eV or to a current intensity of 50 nA until a radiation dose of $10^{-4}$ coulombs/cm$^2$ had been applied. The irradiated piece of foil was then "developed" with toluene. On most parts of the foil which had been exposed to the electron beam, the polymer layer remained clearly intact. The crosslinked polymer film proved to be completely resistant to subsequent etching in iron(III)chloride solution. The complete dissolution of the unprotected copper did no damage either to the resist lacquer film or to the underlying copper.

EXAMPLE 2

A polymer was prepared using the method of Example 1 from 9.6 g of butylacrylate, 10.5 g of hydroxyethylacrylate, 0.35 g of azoisobutyrodinitrile and 15.2 g of p-methoxy phenyl maleic imide in a total of 250 g of methylethyl ketone, and then purified by dissolution in and reprecipitation from petroleum ether.

A thin film of this polymer also crosslinked under the irradiation conditions specified in Example 1. Unexposed parts of the film could be dissolved with benzene.

EXAMPLE 3

A polymer was prepared using the method of Example 1 from 9.6 g of butylacrylate, 10.5 g of hydroxyethylacrylate, 0.35 g of azoisobutyrodinitrile and 15.3 g of p-nitrophenyl maleic imide dissolved in a total of 250 g of methylethyl ketone. Under irradiation described in Example 1, the film crosslinked with a radiation dose of $5 \times 10^{-4}$ coulombs/cm$^2$.

EXAMPLE 4

In the apparatus described in Example 1, a mixture of 20 g of methylethyl ketone, 9.6 g of butylacrylate, 10.5 g of hydroxyethylacrylate and 18.4 g of p-carboxyethyl phenyl maleic imide was heated under reflux while nitrogen was passed thereover. A solution of 0.39 g of asoisobutyronitrile in 20 g of methylethyl ketone was then added dropwise over a period of 3 hours. After boiling under reflux for another hour, the polymer was worked up in the same way as described in Example 1.

A thin layer of this polymer crosslinked under the conditions specified in Example 1.

EXAMPLE 5

Using the method of Example 1, a polymer was prepared from 9.6 g of butylacrylate, 10.5 g of hydroxyethylacrylate, 0.4 g of azoisobutyrodinitrile and 20.07 g of 2,4-dimethoxy-5-chlorophenyl maleic imide dissolved in a total of 250 g of methylethyl ketone.

EXAMPLE 6

Using the method of Example 1, a polymer was prepared from 9.6 g of butylacrylate, 10.5 g of hydroxyethylacrylate, 0.37 g of azosibotyrodinitrile and 17.82 g of 3-chloro-4-methoxy phenyl maleic imide dissolved in a total of 300 g of methylethyl ketone.

EXAMPLE 7

Using the method of Example 1, a polymer was produced from 9.6 g of butylacrylate, 10.5 g of hydroxyethylacrylate, 4.35 g of azoisobutyrodinitrile and 15 g of $\alpha$-naphthyl maleic imide dissolved in a total of 60 g of methylethyl ketone. Imagewise irradiation under the conditions specified in Example 1 produced an image which could be developed with toluene.

EXAMPLE 8

The Polymer produced in accordance with Example 5 using 2,4-dimethoxy-5-chlorophenyl maleic imide was applied as a thin layer to a copper-lined polyester film. A piece of this foil measured $2 \times 2$ cm was introduced into an electron microscope where part of its surface was exposed to an electron beam having an energy of 20,000 eV or to a current intensity of 50 nA until a radiation dose of $10^{-4}$ coulombs/cm$^2$ had been applied. The irradiated piece of foil was then "developed" with toluene. On those parts of the foil which had been exposed to the electron beam, the polymer layer remained clearly intact. The crosslinked polymer film proved to be totally resistant to subsequent etching in iron(III) chloride solution, a high-definition etched image of the irradiated zone being obtained.

EXAMPLE 9

Following the procedure of Example 8, the polymer produced in accordance with Example 6 using 3-chloro-4-methoxyphenyl maleic imide was exposed to an electron beam in an electron microscope. In this case, too, a radiation dose of $10^{-4}$ coulombs/cm$^2$ was sufficient to crosslink the polymer layer so that it was completely resistant to etching. Once again, the etched images obtained were distinguished by their very high edge definition.

EXAMPLE 10

Following the procedure of Example 8, a polymer which had been produced from 9.6 g of butylacrylate, 10.5 g of hyroxyethylacrylate and 15.2 g of p-acetylphenyl maleic imide was exposed to the action of a concentrated electron beam in an electron microscope. Once again, a radiation does of $10^{-4}$ coulombs/cm$^2$ for a voltage of 20 kV and a current intensity of 10nA was sufficient to crosslink the film until it was completely resistant to etching with iron(III)chloride solution.

EXAMPLE 11

Using the method of Example 1, a polymer was produced from 9.6 g of butylacrylate and 10.4 g of 2,4,5-trichlorophenyl maleic imide in 100 g of methylethyl ketone. Under the action of an electron beam in an electron microscope, a film produced with this polymer crosslinked under the conditions specified in Example 8 after a radiation dose of $8 \times 10^{-4}$ coulombs/cm$^2$ had been applied. This crosslinked film was also distinguished by its high resistance to etching.

EXAMPLE 12

Using the method of Example 1, a polymer was produced from 9.6 g of butylacrylate, 7.8 g of p-chlorophenyl maleic imide and 0.17 g of asoisobutyrodinitrile dissolved in a total of 100 g of methylethyl ketone. After working up in the usual way, this polymer was mixed in equal parts with another vinyl polymer consisting of 46% by weight of styrene, 31% by weight of butylacrylate and 23% by weight of hydroxypropylmethacrylate. A solution of this mixture in methylene chloride was applied as a thin layer to a metal substrate and irradiated imagewise in the same way as described in Example 1. An image developable with ethanol was obtained.

EXAMPLE 13

Following the procedure of Example 12, the polymer produced using p-chlorophenyl maleic imide was mixed in equal parts with a polyester of trimethylol propane and phthalic acid anhydride having an OH-number of 250. After imagewise irradiation as detailed in Example 12, a polymer film of this mixture produced an image developable with toluene.

EXAMPLE 14

In the apparatus described in Example 1, a vinyl polymer was produced from equal parts of methyl methacrylate and p-methoxy-N-phenyl acrylamide in methylethyl ketone as solvent. This polymer was mixed in equal parts with a vinyl polymer comprising 46% by weight of styrene, 31% by weight of butylacrylate and 22% by weight of hydroxypropyl methacrylate. A thin film of this mixture on a metal surface crosslinked after irradiation in accordance with that described in Example 1.

EXAMPLE 15

Using the apparatus described in Example 1, 50 g of toluene were heated to boiling temperature while nitrogen was passed therethrough. A mixture of 8.01 g (0.025 mole) of pentachlorophenyl acrylic acid ester, 3.2 g (0.025 mole) of butylacrylate, 3.4 g (0.025 mole) of hydroxybutylacrylate, 0.15 g (1%) of benzoyl peroxide and 50 g of toluene was then added dropwise over a period of 1 hour. A solution of 0.08 g of benzoyl peroxide in 10 g of toluene was then added dropwise over a period of another hour. After a further hour, the polymer solution was concentrated and dissolved in and reprecipitated from petroleum ether in the same way as described in Example 1. A 1μ m thick film of this polymer applied to a copper-lined polyester film crosslinked under the action of electron beams in an electron microscope under the conditions specified in Example 8 after a radiation dose of $5 \times 10^{-5}$ coulombs/cm$^2$ had been applied.

I claim:

1. A method of crosslinking a coating on a substrate, said coating comprising a copolymer of (A) 10 to 90 moles of a $C_1$-$C_{20}$ alkyl ester of at least one member of the group consisting of acrylic acid and methacrylic acid; (B) 0 to 50 moles of a hydroxyl group containing $C_1$-$C_{10}$ alkyl ester of at least one member selected from the group consisting of acrylic acid and methacrylic acid and (C) 3 to 70 moles of a monomer of the formula

wherein Ar is a monofunctional to hexafunctional aryl radical having from 6 to 18 carbon atoms and consisting of from 1 to 3 rings; R is hydrogen, alkyl having 1 to 12 carbon atoms, halogen, alkoxy having 1 to 12 carbon atoms, —O—(CH$_2$CH$_2$—O)$_{1-4}$—H, —O—(CHCH$_3$—CH$_2$O)$_{1-4}$—H, nitro, —COOH, —CHO, —COO-alkyl wherein said alkyl has 1 to 12 carbon atoms, —CN, —CONH$_2$, —CONH-alkyl wherein said alkyl has 1 to 12 carbon atoms, —CON(alkyl)$_2$ wherein alkyl has from 1 to 12 carbon atoms or —NHCO-alkyl wherein said alkyl has 1 to 12 carbon atoms and n is an integer of from 1 to 5, said method comprising subjecting said coating on said substrate to electron beam radiation at a dose of $10^{-6}$ to $10^{-3}$ coulombs/cm$^2$ at an energy of from 1,000 to 100,000 eV.

2. The method of claim 1 wherein (B) is present in an amount of from 10 to 50 moles.

3. The method of claim 1 wherein (C) is present in an amount of from 10 to 50 moles.

4. The method of claim 1 wherein said copolymer further comprises from 0 to 30 moles of unsaturated carboxylic acid.

5. The method of claim 4 wherein said unsaturated carboxylic acid is acrylic acid, methacrylic acid, maleic acid or fumaric acid in copolymerized form.

6. The method of claim 1 wherein said copolymer further comprises from 0 to 40 moles of acrylamide, methacrylamide or the N-alkyl substitution products thereof in copolymerized form.

7. The method of claim 1 wherein the copolymer further comprises from 0 to 70 moles of styrene, α-methylstyrene, acrylonitrile, vinylacetate, vinyl propionate, a vinylalkyl ether having from 1 to 8 carbon atoms in the alkyl moiety, methacrylonitrile, allylacetate, vinyl chloride, vinylidene chloride, maleic imide or maleic anhydride in copolymerized form.

8. The method of claim 1 wherein compound (A) is methylacrylate, ethylacrylate, butylacrylate, propylacrylate, ethylhexylacrylate, dodecylacrylate, methyl methacrylate, ethyl methacrylate, propyl methacrylate, butyl methacrylate or dodecyl methacrylate.

9. The method of claim 1 wherein component (B) is hydroxyethylacrylate, hydroxypropylacrylate, hydroxyethyl methacrylate, or hydroxypropyl methacrylate.

10. The method of claim 1 wherein Ar is phenyl, biphenyl, anthracenyl, phenanthryl or naphthyl.

11. The method of claim 1 wherein R is halogen.

12. The method of claim 3 wherein said halogen is chlorine.

* * * * *